(12) United States Patent
Blankenship et al.

(10) Patent No.: US 9,639,490 B2
(45) Date of Patent: May 2, 2017

(54) RING PROTOCOL FOR LOW LATENCY INTERCONNECT SWITCH

(75) Inventors: Robert G. Blankenship, Tacoma, WA (US); Geeyarpuram N. Santhanakrishnan, Mercer Island, WA (US); Yen-Cheng Liu, Portland, OR (US); Bahaa Fahim, Santa Clara, CA (US); Ganapati N. Srinivasa, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 265 days.

(21) Appl. No.: 13/994,792

(22) PCT Filed: Nov. 29, 2011

(86) PCT No.: PCT/US2011/062311
§ 371 (c)(1),
(2), (4) Date: Jul. 24, 2014

(87) PCT Pub. No.: WO2013/081579
PCT Pub. Date: Jun. 6, 2013

(65) Prior Publication Data
US 2015/0269104 A1 Sep. 24, 2015

(51) Int. Cl.
*G06F 13/42* (2006.01)
*G06F 13/40* (2006.01)
(Continued)

(52) U.S. Cl.
CPC ...... *G06F 13/4022* (2013.01); *G06F 13/1668* (2013.01); *G06F 13/4247* (2013.01);
(Continued)

(58) Field of Classification Search
CPC ... G06F 13/4221; G06F 17/13; G06F 17/5036
See application file for complete search history.

(56) References Cited

U.S. PATENT DOCUMENTS 4,646,232 A * 2/1987 Chang ................... G06F 13/128
710/113
5,237,657 A * 8/1993 Pearman ............. G06F 3/04845
345/172

(Continued)

FOREIGN PATENT DOCUMENTS

| GB | 2460747 A | 12/2009 |
|----|-----------|---------|
| WO | 02/15470 A2 | 2/2002 |
| WO | 2013/081579 A1 | 6/2013 |

OTHER PUBLICATIONS

Ziakas et al, Intel QuickPath Interconnect Architectural Features Supporting Scalable System Architectures, 2010 18th. IEEE Symposium on High Performance Interconnects.*

(Continued)

*Primary Examiner* — Henry Tsai
*Assistant Examiner* — Christopher A Daley
(74) *Attorney, Agent, or Firm* — Law Office of R. Alan Burnett, P.S

(57) ABSTRACT

Methods, systems, and apparatus for implementing low latency interconnect switches between CPU's and associated protocols. CPU's are configured to be installed on a main board including multiple CPU sockets linked in communication via CPU socket-to-socket interconnect links forming a CPU socket-to-socket ring interconnect. The CPU's are also configured to transfer data between one another by sending data via the CPU socket-to-socket interconnects. Data may be transferred using a packetized protocol, such as QPI, and the CPU's may also be configured to support coherent memory transactions across CPU's.

19 Claims, 11 Drawing Sheets

(51) Int. Cl.
*G06F 13/16* (2006.01)
*G06F 17/13* (2006.01)
*G06F 17/50* (2006.01)

(52) U.S. Cl.
CPC .......... *G06F 13/4291* (2013.01); *G06F 17/13* (2013.01); *G06F 17/5036* (2013.01)

(56) References Cited

U.S. PATENT DOCUMENTS

| | | | | |
|---|---|---|---|---|
| 5,436,624 | A * | 7/1995 | Pearce | H04L 12/437 340/3.44 |
| 5,793,946 | A | 8/1998 | Gauthier et al. | |
| 7,328,144 | B1 * | 2/2008 | Grier | G06F 9/546 703/22 |
| 7,836,229 | B1 | 11/2010 | Singh et al. | |
| 2003/0206527 | A1 * | 11/2003 | Yim | H04L 12/437 370/238 |
| 2009/0034412 | A1 | 2/2009 | Sakauchi et al. | |
| 2009/0063812 | A1 * | 3/2009 | Todaka | G06F 11/1443 712/28 |
| 2010/0023595 | A1 * | 1/2010 | McMillian | G06F 15/17 709/212 |
| 2010/0082858 | A1 * | 4/2010 | Akkerman | G06F 12/0831 710/52 |
| 2010/0257294 | A1 | 10/2010 | Regnier et al. | |
| 2011/0119322 | A1 * | 5/2011 | Li | G06F 15/7842 709/201 |
| 2011/0197012 | A1 | 8/2011 | Liao et al. | |
| 2011/0307647 | A1 * | 12/2011 | Stalzer | G06F 12/0866 711/103 |
| 2011/0314255 | A1 * | 12/2011 | Krishna | G06F 15/17337 712/16 |
| 2012/0047333 | A1 * | 2/2012 | Kottapalli | G06F 12/0822 711/146 |
| 2012/0203946 | A1 * | 8/2012 | Golander | G06F 13/00 710/111 |
| 2012/0311360 | A1 * | 12/2012 | Balasubramanian | G06F 1/3237 713/323 |
| 2013/0151782 | A1 * | 6/2013 | Liu | G06F 12/0831 711/130 |
| 2014/0156896 | A1 * | 6/2014 | Chang | G06F 13/24 710/267 |

OTHER PUBLICATIONS

Kottapalli et al, Nehalem-EX CPU Architecture, Mar. 2009.*
Extended European Search Report received for European Patent Application No. 11876811.8, mailed on May 13, 2015, 5 pages.
International Preliminary Report on Patentability and Written Opinion received for PCT Patent Application No. PCT/US2011/062311, mailed on Jun. 12, 2014, 6 pages.
International Search Report and Written Opinion received for PCT Application No. PCT/US2011/062311, mailed on Jul. 31, 2012, 9 pages.

* cited by examiner

RING PROTOCOL FOR LOW LATENCY INTERCONNECT SWITCH

FIELD OF THE INVENTION

The field of invention relates generally to computer system interfaces and, more specifically but not exclusively relates to techniques for facilitating low latency communication between components and agents on separate sockets.

BACKGROUND INFORMATION

Computer systems typically employ one or more interconnects to facilitate communication between system components, such as between processors and memory. Interconnects and/or expansion interfaces may also be used to support built-in and add on devices, such as IO (input/output) devices and expansion cards and the like. For many years after the personal computer was introduced, the primary form of interconnect was a parallel bus. Parallel bus structures were used for both internal data transfers and expansion buses, such as ISA (Industry Standard Architecture), MCA (Micro Channel Architecture), EISA (Extended Industry Standard Architecture) and VESA Local Bus. In the early 1990's Intel Corporation introduced the PCI (Peripheral Component Interconnect) computer bus. PCI improved on earlier bus technologies by not only increasing the bus speed, but also introducing automatic configuration and transaction-based data transfers using shared address and data lines.

As time progressed, computer processor clock rates where increasing at a faster pace than parallel bus clock rates. As a result, computer workloads were often limited by interconnect bottlenecks rather than processor speed. Although parallel buses support the transfer of a large amount of data (e.g., 32 or even 64 bits under PCI-X) with each cycle, their clock rates are limited by timing skew considerations, leading to a practical limit to maximum bus speed. To overcome this problem, high-speed serial interconnects were developed. Examples of early serial interconnects include Serial ATA, USB (Universal Serial Bus), FireWire, and RapidIO.

Another standard serial interconnect that is widely used is PCI Express, also called PCIe, which was introduced in 2004 under the PCIe 1.0 standard. PCIe was designed to replace older PCI and PCI-X standards, while providing legacy support. PCIe employs point-to-point serial links rather than a shared parallel bus architecture. Each link supports a point-to-point communication channel between two PCIe ports using one or more lanes, with each lane comprising a bi-directional serial link. The lanes are physically routed using a crossbar switch architecture, which supports communication between multiple devices at the same time. As a result of its inherent advantages, PCIe has replaced PCI as the most prevalent interconnect in today's personal computers. PCIe is an industry standard managed by the PCI-SIG (Special Interest Group). As such, PCIe pads are available from many ASIC and silicon vendors.

Recently, Intel introduced the QuickPath Interconnect® (QPI). QPI was initially implemented as a point-to-point processor interconnect replacing the Front Side Bus on platforms using high-performance processors, such as Intel® Xeon®, and Itanium® processors. QPI is scalable, and is particularly advantageous in systems having multiple processors employing shared memory resources. QPI transactions employ packet-based transfers using a multi-layer protocol architecture. Among its features is support for coherent transaction (e.g., memory coherency).

Other recent advancements include multi-core processors, Systems on a Chip (SoC), and computer systems implementing multiple Central Processing Unit (CPU) sockets. In order to take advantage of the scalability offered by these advances, the processor resources should be able to access memory resources in a non-segregated manner (i.e., a given processing resource may access all/most memory resources), thus requiring communication between socket components. Currently, communication between sockets is facilitated using a cross-bar interconnect (e.g., QPI implemented via a cross-bar fabric mesh). As the number of sockets and cores increase, latency for point-to-point communication via virtual links implemented via such cross-bar interconnect likewise increases. Accordingly, it would be advantageous to implement a scalable architecture that does not have the latency increases associated with cross-bar interconnects.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 2b is a detailed block schematic diagram showing selective details of the internal architectures of four CPU's installed in sockets 0-3;

DETAILED DESCRIPTION

Figure 1:
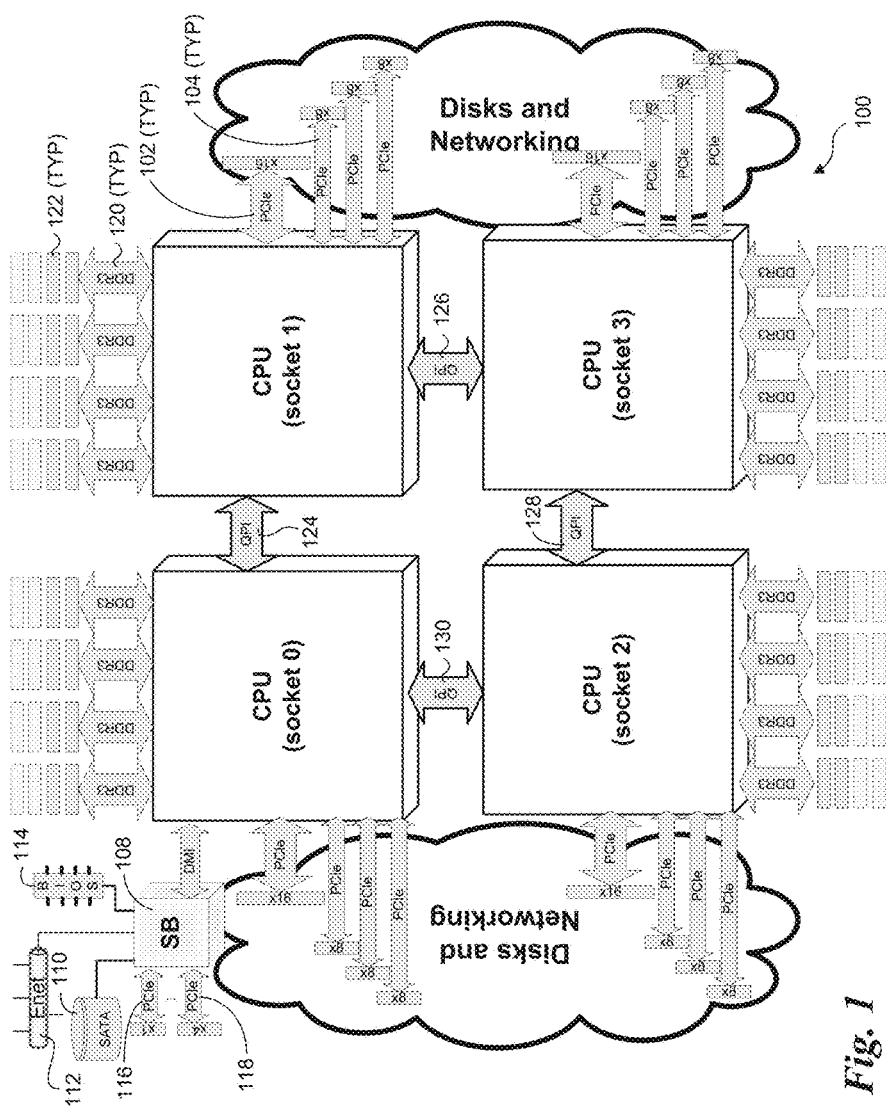
FIG. 1 is a block schematic diagram of a system architecture including four CPU's communicatively coupled via four CPU socket-to-socket QPI links.

Embodiments of methods, systems, and apparatus for implementing low latency interconnect switches and associated protocols are described herein. In the following description, numerous specific details, such as implementations employing QPI interconnects, are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. For example, the labeling of the nodes in various Figures provides information identifying the node and/or its function; such information cannot be conveyed alone with separate reference numbers. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity.

FIG. 1 shows an architecture 100 corresponding to an exemplary implementation of low latency interconnect switches to facilitate communication between various CPU components and system resources across CPU sockets, such as memory, disk drives, and network resources. Architecture 100 includes four CPU sockets 0, 1, 2, and 3, which are arranged in a four quadrant configuration. However, this is merely exemplary, as the number of CPU sockets may generally range from 2 or more, and the CPU sockets may be arranged in a generally square or rectangular pattern, and/or may have all or selected CPU sockets arranged in a generally linear manner (i.e., in a single row).

As a general note, references to the term "CPU sockets" are made frequently herein. A CPU socket generally represents an electromechanical interface component between a CPU (also referred to herein as a processor) and a processor board typically comprising a type of printed circuit board, wherein pins or pads on the CPU are mated to corresponding components (e.g., pin receptacles or pads) on the CPU socket. The processor board may typically be referred to as a motherboard (for personal computers and servers) or a main board, or a blade or card (for blade servers and cards rack configurations). For simplicity and convenience, the term "main board" will generally be used herein, with the understanding that this terminology applies to any type of board on which CPU sockets may be installed.

Also, references will be made to CPU sockets that illustrate internal components of CPU's installed in those sockets. Since the CPU's are configured to be installed in corresponding CPU sockets (and thus would be covering the sockets), reference to a CPU socket that shows selected components of a CPU shall be viewed as if a CPU is installed in the socket being referenced.

Returning to FIG. 1, each of the CPU sockets 0-3 is configured to provide an interface to various processor related components that are logically aggregated to form a CPU, as would be recognized by those skilled in the processor arts. These include various internal (to the CPU) components, such as processor cores, various levels of caches, caching agents, memory-related components, and corresponding interconnects. For convenience and clarity these components and interconnects are not shown in FIG. 1.

Each of the CPU's installed in CPU sockets 0-3 have controllers and interfaces for facilitating communication with various external components, such as memory, disk drives and other I/O devices, network interfaces, BIOS/firmware, and peripheral devices. Some of the interfaces for facilitating communication to the external components include various PCIe interconnects, generally depicted as double-arrowed x16 PCIe interfaces 102 with a corresponding box labeled x16 (indicating a link width of 16 lanes), and x8 PCIe interfaces 104 with a corresponding box labeled x8 (indicating a link width of 8 lanes). However, the link widths and numbers of the PCIe interfaces are merely exemplary, as the actual links may be between 1 and 32 (x32) lanes wide. The PCIe interfaces are used for interfacing with various peripheral and system components, such as PCIe expansion slots, video cards, video chips, etc.

Architecture 100 also includes a South Bridge complex 106 connected to CPU socket 0 via a Direct Media Interface (DMI) 108. South Bridge complex 106 includes various I/O interfaces and associated circuitry for facilitating communication with external peripherals and components common to computer systems and servers, as illustrated by a Serial ATA (SATA) drive 110, an Ethernet interface 112, and BIOS/Firmware 114. Also depicted are an x1 PCIe interface 116 and an x4 PCIe interface 118, each of which is generally illustrative of PCIe interfaces of various lane widths that may be supported by South Bridge complex 106.

Each of the CPU's in CPU sockets 0-3 also provides facilities for interfacing and accessing memory resources. These are depicted as DDR3 memory interfaces 120 and memory blocks 122. As before, the number and type of memory interfaces are merely exemplary, as are the number of memory blocks depicted in FIG. 1. It will be understood to those skilled in the art that each CPU socket may include associated memory controllers, caching agents, and cache levels to facilitate memory related operations implemented by the various processing cores.

Architecture 100 further includes four CPU socket-to-socket QPI links 124, 126, 128, and 130 that form interconnects between CPU sockets 0-3, as shown. As will be described in further detail below, in one embodiment each of the QPI links include a QPI switch that facilitates transfer of packets across ring interconnects that are internal to each CPU socket, thereby forming an "external" ring interconnect that enabled data to be transferred between CPU's installed in the CPU sockets.

Figure 2:
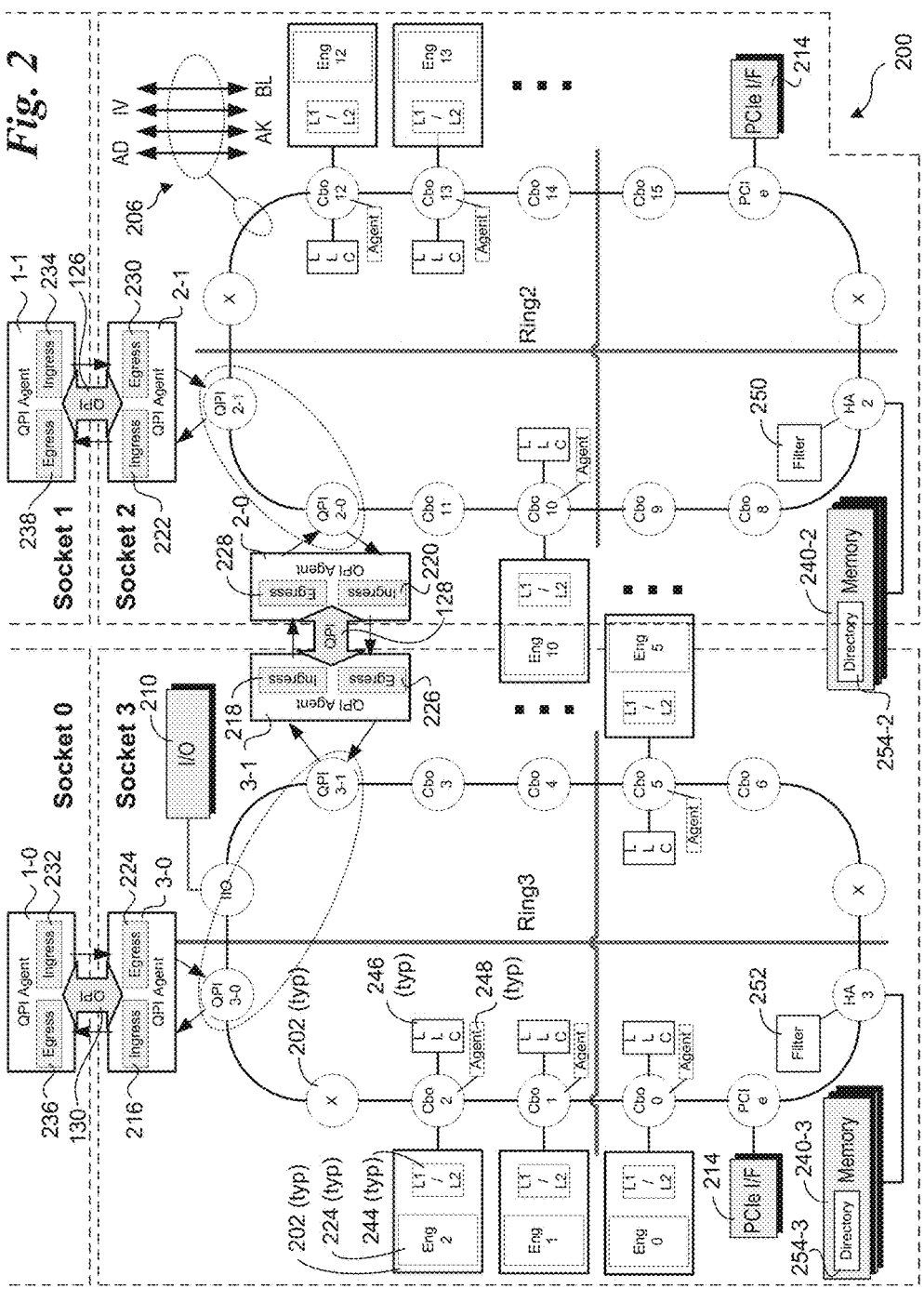
FIG. 2 is a detailed block schematic diagram showing details of the internal architectures of a pair of CPU's when installed in sockets 2 and 3 or the system architecture of FIG. 1.
Figure 2A:
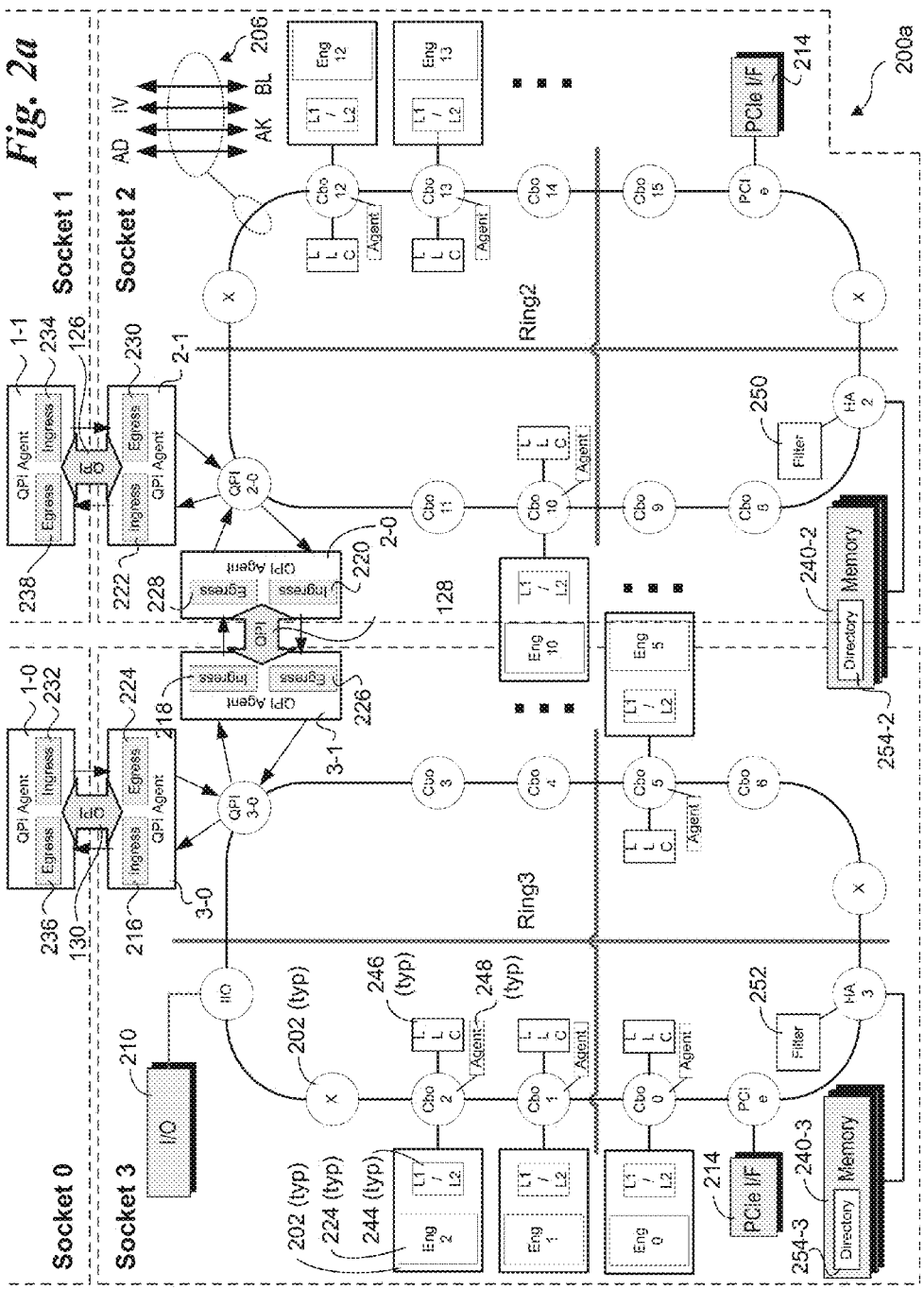
FIG. 2b is a detailed block schematic diagram showing an alternative configuration to that shown in FIG. 2, wherein single QPI nodes on each CPU are used to interface to CPU socket-to-socket QPI links.
FIG. 2c is a block schematic diagram showing an abstracted version of the diagram in FIG. 2a that emphasizes the CPU socket-to-socket QPI links.
FIG. 2d is a block schematic diagram showing an abstracted version of the diagram in FIG. 2b that emphasizes the CPU socket-to-socket QPI links.
FIG. 2e is a block schematic diagram illustrating an alternative CPU configuration in which multiple CPU's and CPU sockets are arranged in a linear manner on a main board.

Further details of one embodiment of a system 200 in accordance with architecture 100 are shown in FIG. 2. System 200 is illustrative of an advanced system architecture including SoC processors (CPU's) supporting multiple processor cores 202, each coupled to a respective node 204 on a ring interconnect, labeled and referred to herein as Ring2 and Ring3 (corresponding to CPU's installed in CPU sockets 2 and 3, respectfully). For simplicity, the nodes for each of the Ring3 and Ring2 interconnects are shown being connected with a single line. As shown in detail 206, in one embodiment each of these ring interconnects include four separate sets of "wires" or electronic paths connecting each node, thus forming four rings for each of Rng2 and Ring3. In actual practice, there are multiple physical electronic paths corresponding to each wire that is illustrated. It will be understood by those skilled in the art that the use of a single line to show connections herein is for simplicity and clarity, as each particular connection may employ one or more electronic paths.

In the context of system 200, a cache coherency scheme may be implemented by using independent message classes. Under one embodiment of a ring interconnect architecture, independent message classes may be implemented by employing respective wires for each message class. For example, in the aforementioned embodiment, each of Ring2 and Ring3 include four ring paths or wires, labeled and referred to herein as AD, AK, IV, and BL. Accordingly, since the messages are sent over separate physical interconnect paths, they are independent of one another from a transmission point of view.

In one embodiment, data is passed between nodes in a cyclical manner. For example, for each real or logical clock cycle (which may span one or more actual real clock cycles), data is advanced from one node to an adjacent node in the ring. In one embodiment, various signals and data may travel in both a clockwise and counterclockwise direction around the ring. In general, the nodes in Ring2 and Ring 3 may comprise buffered or unbuffered nodes. In one embodiment, at least some of the nodes in Ring2 and Ring3 are unbuffered.

Each of Fing2 and Fing3 include a plurality of nodes 204. Each node labeled Cbo n (where n is a number) is a node corresponding to a processor core sharing the same number n (as identified by the core's engine number n). There are also other types of nodes shown in system 200 including QPI nodes 3-0, 3-1, 2-0, and 2-1, an IIO node, and PCIe nodes. Each of QPI nodes 3-0, 3-1, 2-0, and 2-1 is operatively coupled to a respective QPI Agent 3-0, 3-1, 2-0, and 2-1. The IIO node is operatively coupled to an Input/Output interface 210. Similarly, PCIe nodes are operatively coupled to PCIe interfaces 212 and 214. Further shown are a number of nodes marked with an "X"; these nodes are used for timing purposes. It is noted that the QPI, IIO, PCIe and X nodes are merely exemplary of one implementation architecture, whereas other architectures may have more or less of each type of node or none at all. Moreover, other types of nodes (not shown) may also be implemented.

Figure 5:
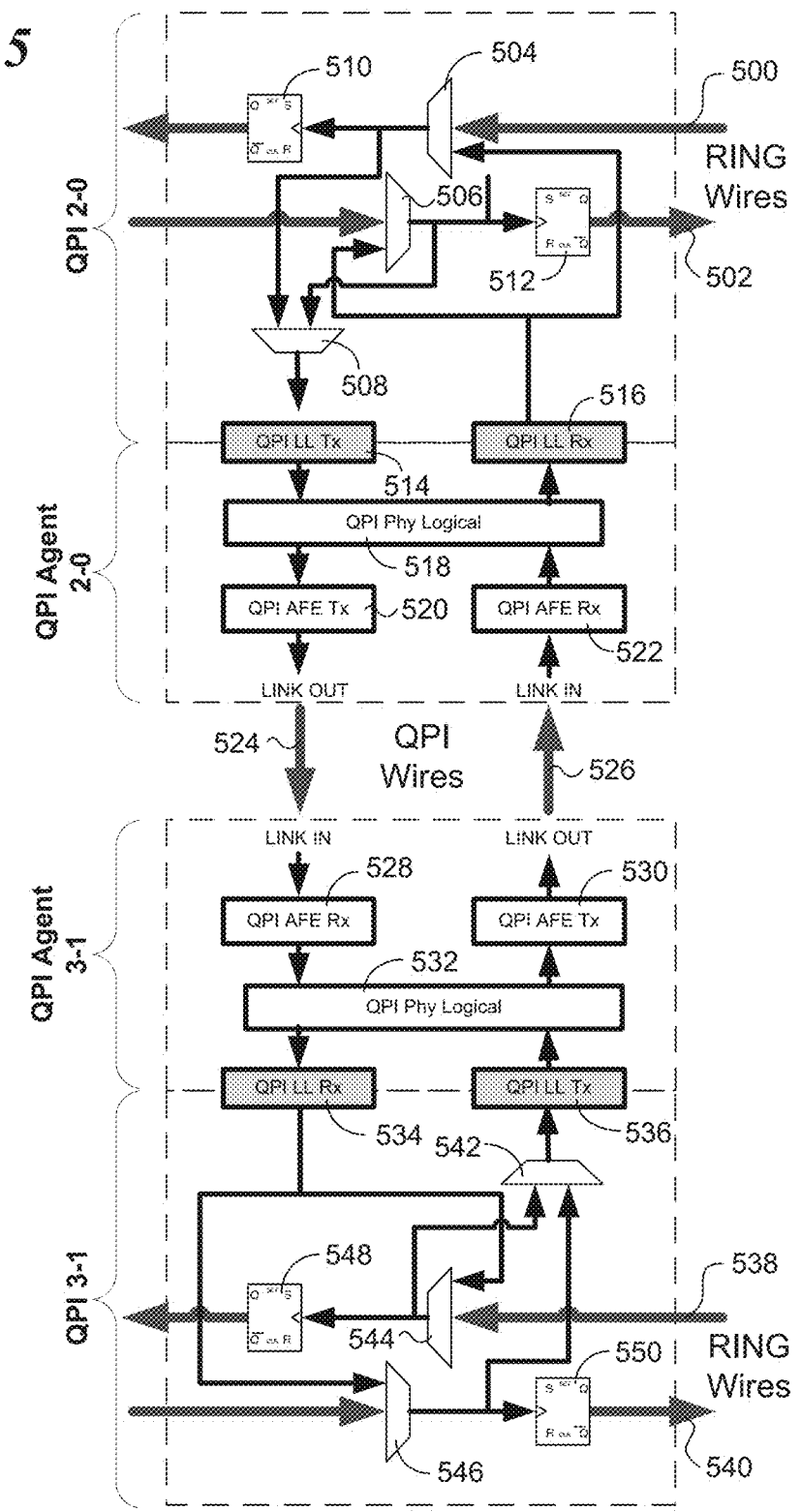
FIG. 5 is a block schematic diagram illustrating components and logic for interfacing QPI agents and QPI nodes to ring interconnects internal to respective CPU's
Figure 5A:
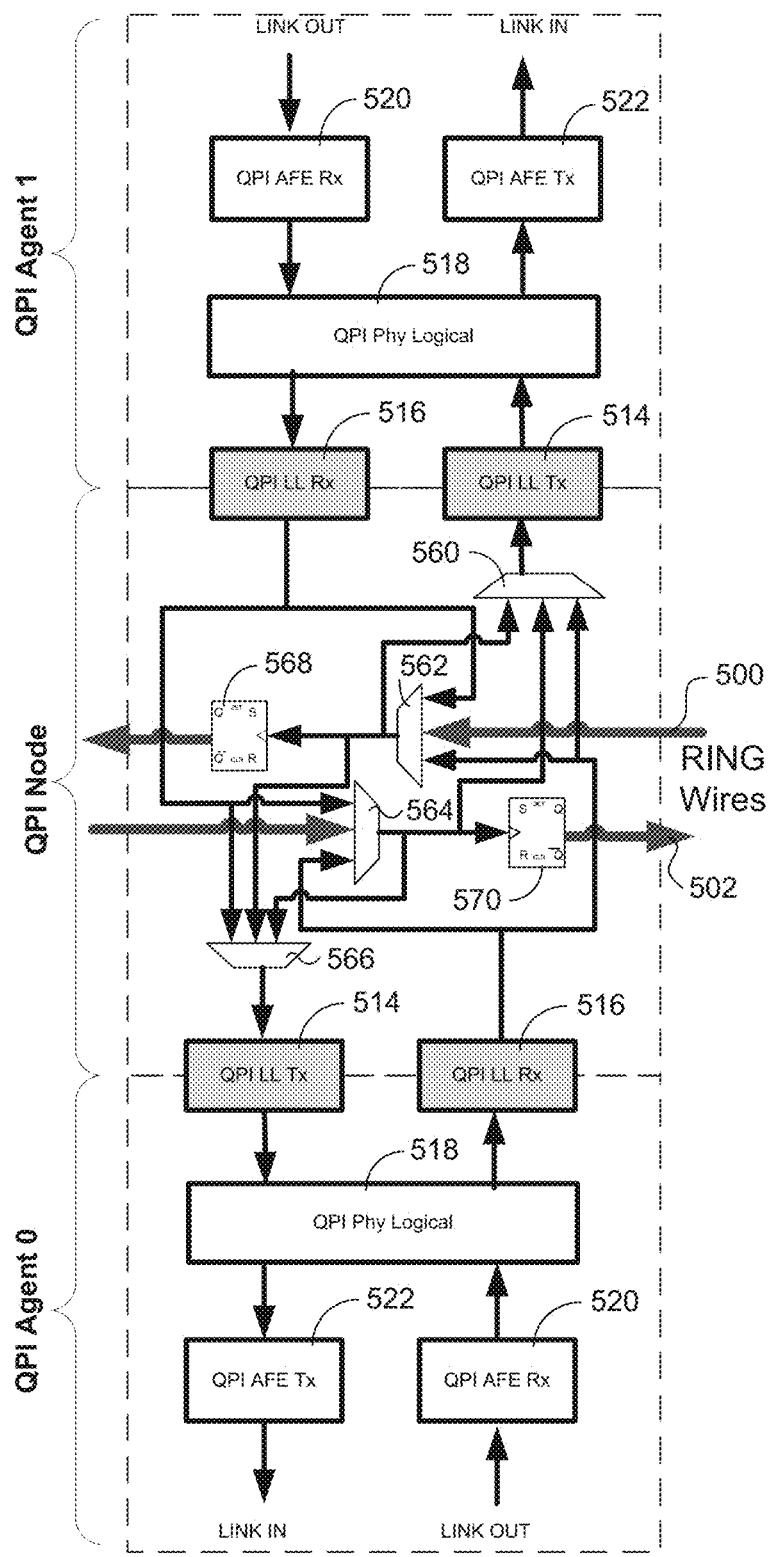
FIG. 5a is a block schematic diagram illustrating components and logic for interfacing two QPI agents to a common QPI node coupled to an internal ring interconnect.

Each of the QPI agents 3-0, 3-1, 2-0, and 2-1 includes circuitry and logic for facilitating transfer of QPI packets between the QPI agents and the QPI nodes they are coupled to. This circuitry includes ingress and egress buffers, which are depicted as ingress buffers 216, 218, 220, and 222, and egress buffers 224, 226, 228, and 230. Further details of one embodiment of a QPI agent are shown in FIGS. 5 and 5a, as discussed below.

System 200 also shows two additional QPI Agents 1-0 and 1-1, each corresponding to QPI nodes on rings of CPU sockets 0 and 1 (both rings and nodes not shown). As before, each QPI agent includes an ingress and egress buffer, shown as ingress buffers 232 and 234, and egress buffers 236 and 238. Further details of system 200 and a similar system 200a showing all four Rings 0-3 are shown in FIGS. 2a-e.

In the context of maintaining cache coherence in a multi-processor (or multi-core) environment, various mechanisms are employed to assure that data does not get corrupted. For example, in system 200, each of processor cores 202 corresponding to a given CPU is provided access to a shared memory store associated with that socket, as depicted by memory stores 240-3 or 240-2, which typically will comprise one or more banks of dynamic random access memory (DRAM). For simplicity, the memory interface circuitry for facilitating connection to the shared memory store is not shown; rather, the processor cores in each of Ring2 and Ring3 are shown respectively connected to the memory store via a home agent node 2 (HA 2) and a home agent node 3 (HA 3).

As each of the processor cores executes its respective code, various memory accesses will be performed. As is well known, modern processors employ one or more levels of memory cache to store cached memory lines closer to the core, thus enabling faster access to such memory. However, this entails copying memory from the shared (i.e., main) memory store to a local cache, meaning multiple copies of the same memory line may be present in the system. To maintain memory integrity, a cache coherency protocol is employed. Under the well-known MESI cache coherency protocol, when a processor (or core) makes a first copy of a memory line from main memory to its local cache, a mechanism is employed to mark the cache line as Exclusive (E), such that another core attempting to access the same memory line knows it does not have exclusive access to the memory line. If two or more cores have copies of the same cache line and the data in the line has not been changed (i.e., the data in the caches is the same as the line in main memory), the cache lines are in a shared (S) state. Once a change is made to the data in a local cache, the line is marked as modified (M) for that cache, and the other copies of the line are marked as Invalid (I), since they no longer reflect the changed state of data for the line. The state returns to Exclusive once the value in the modified cache line is written back to main memory.

Recently, Intel® Corporation introduced a new Forward or "F" state added to a modified MESI cache coherency protocol called the MESIF cache coherency protocol. The F state indicates that a cache should act as a designated responder for any requests for the given line. In a system of caches employing the MESI protocol, a cache line request that is received by multiple caches holding a line in the S state will receive multiple responses. In a system of caches employing the MESIF protocol, a cache line request will be responded to only by the cache holding the line in the F state.

It is noted that the MESI and MESIF protocols are examples of cache coherency protocols, and accordingly these are not to be limiting, but are used herein to explain the use of exemplary message classes that correspond to messages that are transferred around rings and across CPU sockets in accordance with the architectures disclosed herein.

It is also common to have multiple levels of caches, with caches closest to the processor core having the least latency and smallest size, and the caches further away being larger but having more latency. For example, a typical configuration might employ first and second level caches, commonly referred to as L1 and L2 caches. Another common configuration may further employ a third level or L3 cache.

In the context of system 200, the highest level cache is termed the Last Level Cache, or LLC. For example, the LLC for a given core may typically comprise an L3-type cache if L1 and L2 caches are also employed, or an L2-type cache if the only other cache is an L1 cache. Of course, this could be extended to further levels of cache, with the LLC corresponding to the last (i.e., highest) level of cache.

In the illustrated configuration of FIG. 2, each processor core 202 includes a processing engine 242 coupled to an L1 or L1/L2 cache 244, which are "private" to that core.

Meanwhile, each processor core is also co-located with a "slice" of a distributed LLC 246, wherein each of the other cores has access to all of the distributed slices. Under one embodiment, the distributed LLC is physically distributed among N cores using N blocks divided by corresponding address ranges. Under this distribution scheme, all N cores communicate with all N LLC slices, using an address hash to find the "home" slice for any given address. Suitable interconnect circuitry is employed for facilitating communication between the cores and the slices; however, such circuitry is not show in FIG. 2 for simplicity and clarity.

As further illustrated, each of nodes 204 in system 200 is associated with a cache agent 248, which is configured to perform messaging relating to signal and data initiation and reception in connection with a coherent cache protocol implemented by the system, wherein each cache agent 248 handles cache-related operations corresponding to addresses mapped to its collocated LLC 246. In addition, in one embodiment each of home agents HA2 and HA3 employ respective cache filters 250 and 252, and the various caching and home agents access and update cache line usage data stored in a respective directory 254-2 and 254-3 that is implemented in a portion of shared memory 240-2 and 240-3. It will be recognized by those skilled in the art that other techniques may be used for maintaining information pertaining to cache line usage.

In accordance with one embodiment, a single QPI node may be implemented to interface to a pair of CPU socket-to-socket QPI links to facilitate a pair of QPI links to adjacent sockets. This is logically shown in FIG. 2 and other drawings herein by dashed ellipses that encompass a pair of QPI nodes within the same socket, indicating that the pair of nodes may be implemented as a single node. The use of a single QPI node is further detailed in a system 200a of FIG. 2a, as shown by QPI nodes 3-0 and 2-0. Accordingly, it will be understood that every drawing Figure herein that shows dashed ellipses means the pair of QPI nodes within the dashed ellipses may be implemented as a single QPI node.

Figure 2B:
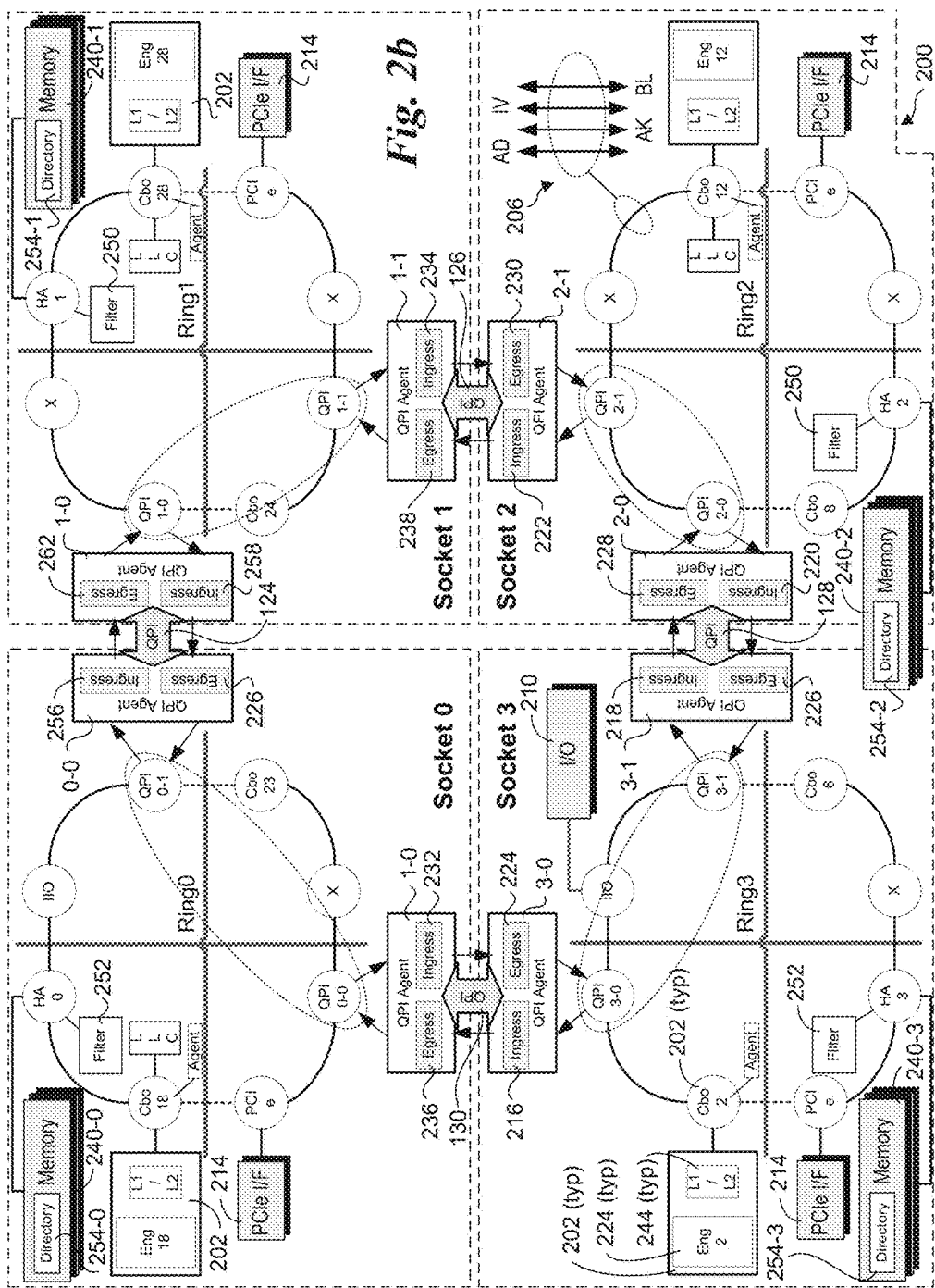

FIG. 2b shows further details of the CPU's configured to be installed in CPU sockets 0 and 1, along with details of a fourth CPU socket-to-socket QPI link 124 and associated QPI agents and buffers. Various details of each of Ring2 and Ring3 have been removed (by comparison with FIG. 2) in order to show four internal ring interconnects (Ring0, Ring1, Ring2 and Ring3) in the same drawing Figure; however, it will be understood that each of Ring0 and Ring1 may have similar components as Ring2 and Ring3 depicted in FIG. 2 or in FIG. 2a. As before, each of Ring0 and Ring1 include nodes labeled Cbo n (such as Cbo 18 and Cbo 23 in Ring0 and Cbo 24 and 28 in Ring2) to which associated processor cores and related cache components are coupled, including L1, L2, and LLC caches with corresponding agents. Also, each of Ring0 and Ring1 include respective home agents HA 0 and HA 1 that are implemented for support coherent memory operations in the manner discussed herein.

The configuration of CPU socket-to-socket QPI link 124 is similar to the CPU socket-to-socket QPI links 126, 128, and 130 shown in FIG. 2 and discussed above. In this instance, the CPU socket-to-socket QPI link supports transfer of QPI signals between QPI node 0-1 on Ring0 and CPI node 1-0 on Ring1, as depicted by QPI agents 0-0 and 1-0, ingress buffers 256 and 258, and egress buffers 260 and 262.

Figure 2C:
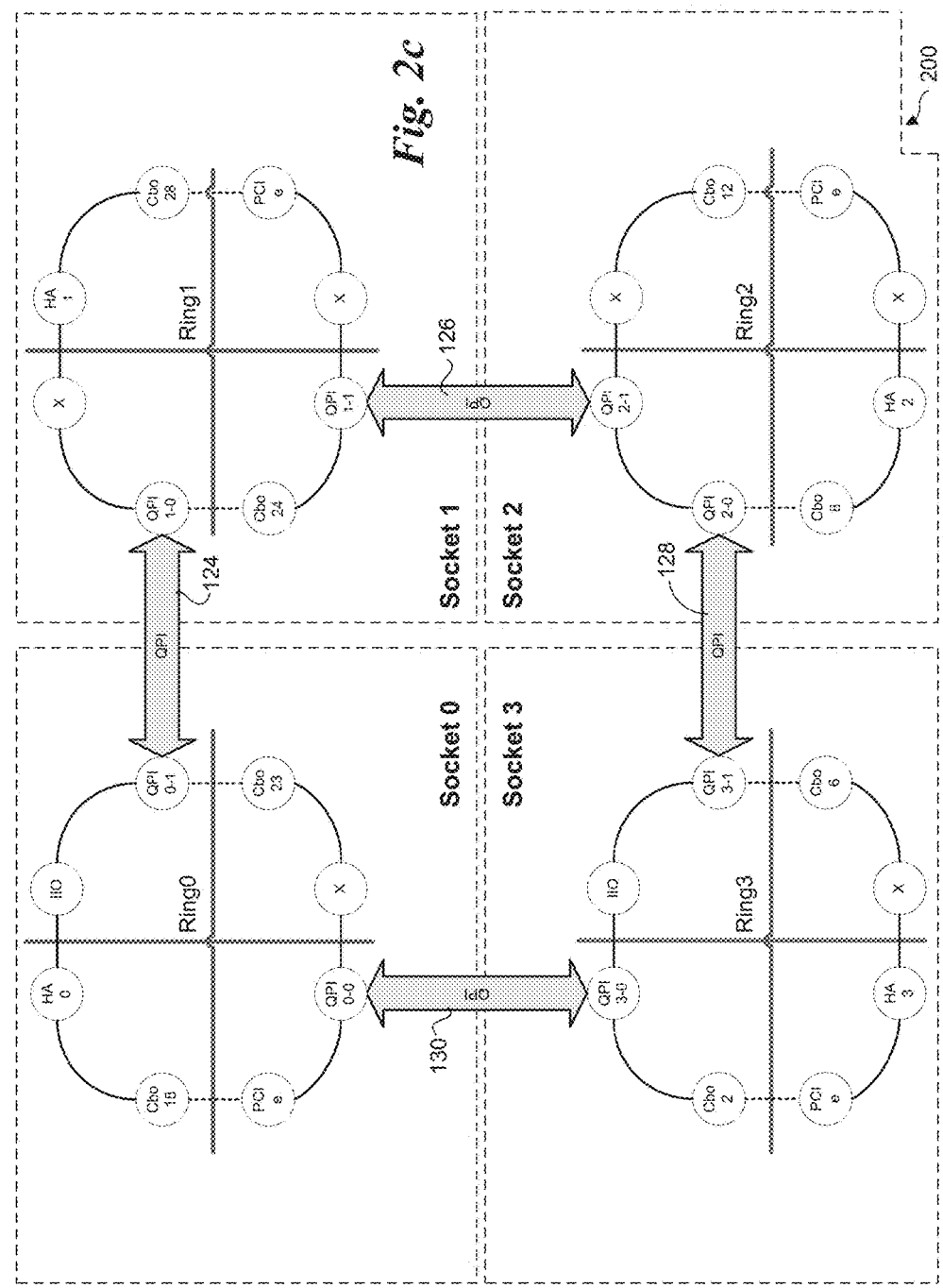
Figure 2D:
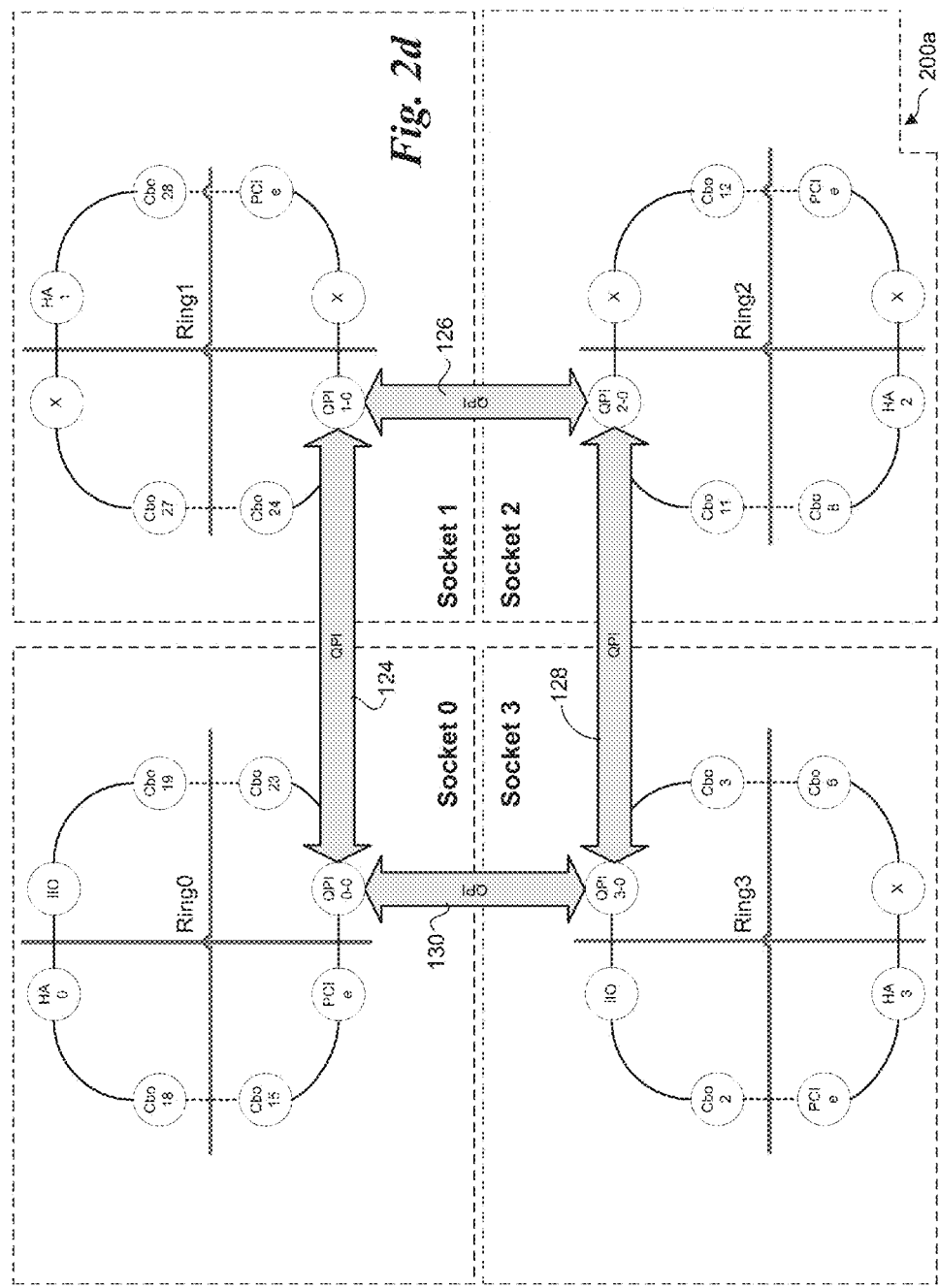

The ring interconnect aspect of the CPU socket-to-socket QPI links is more clearly shown in FIG. 2c, which depicts an abstracted view of system 200, and FIG. 2d, which depicts an abstracted view of system 200a. As can be seen, CPU socket-to-socket QPI links 124, 126, 128, and 130 link the internal ring interconnects Ring0, Ring1, Ring2, and Ring3 such that the combination of the CPU socket-to-socket QPI links and the internal rings form a larger ring interconnect structure. Under this approach, nodes within a given CPU are enabled to communicate with nodes in any of the other CPU's using a common protocol, which in this example is QPI.

Figure 2E:
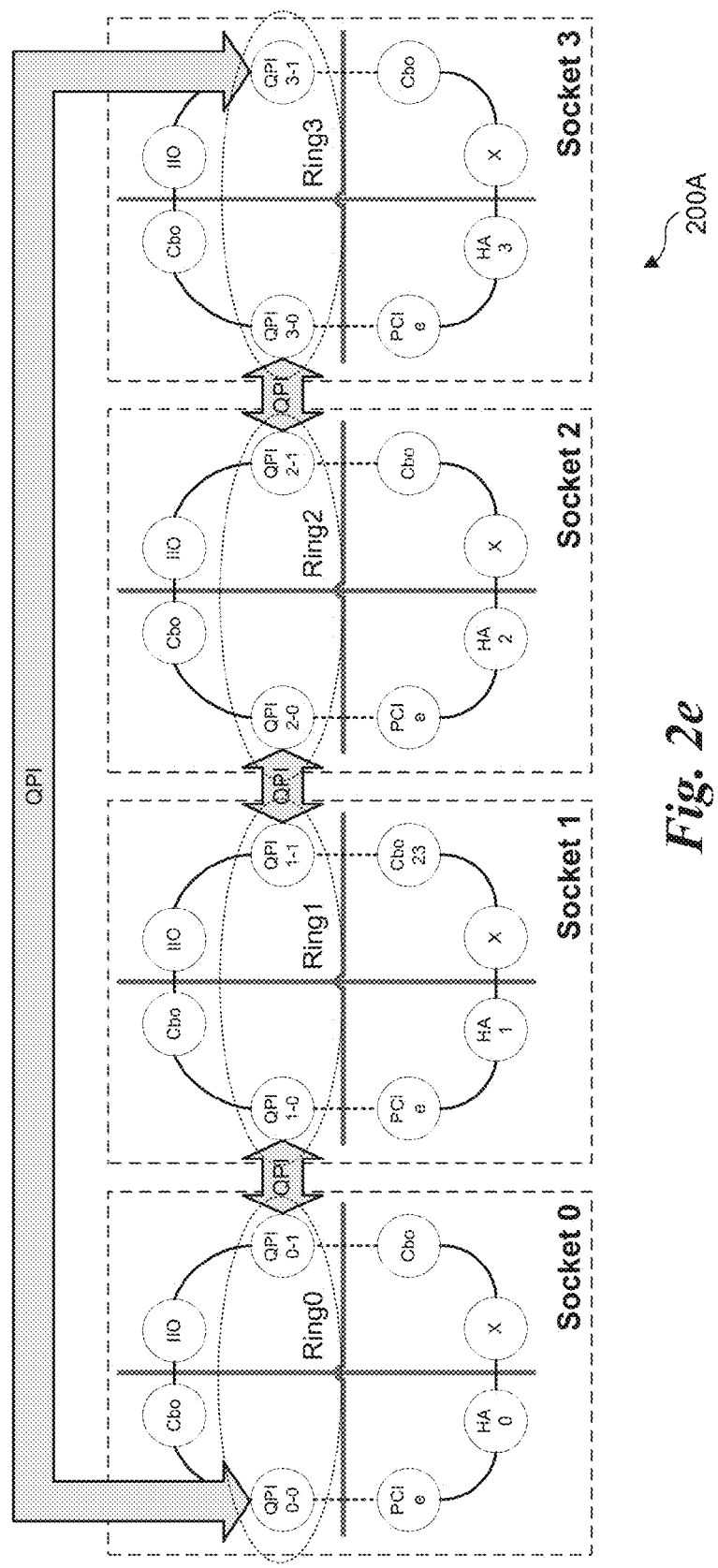

FIG. 2e depicts an alternative configuration in which the CPU sockets are arranged in a linear manner (i.e., physically adjacent to one another in a row). As depicted in FIG. 2e, each of the CPU's installed in Sockets 0, 1, 2, and 3 are depicted to have the same nodes to illustrate that these CPU's would have the same architecture. Notably, the same configuration may generally apply to the four-quadrant architecture of FIGS. 2a-d; however, for convenience in showing the CPU socket-to-socket links, the location of the corresponding QPI nodes on the CPU's have been reordered. It will be understood that the actual physical connection (and associated link wires) would be routed from pin or pad connectors in each CPU socket that are configured to couple to corresponding pins or pads (e.g., flip-chip, Ball Grid Array, etc.) on the CPU's, which internally are connected to applicable QPI nodes via appropriate wiring an vias.

The four-quadrant architecture of FIGS. 2a-d, and the linear architecture of FIG. 2e are generally illustrated of typical arrangements of four or more CPU's connected via CPU socket-to-socket links. For example, a six or eight CPU configuration can be supported by using two rows of three or four CPU sockets, respectively. Optionally, a single row of six or eight CPU sockets could be implemented. Other numbers of CPU's could also be supported in a similar manner. In accordance with the linear configuration of FIG. 2e, Ring0 and Ring3 are termed to be logically adjacent (although physically non-adjacent), since there is a CPU socket-to-socket QPI link between the Sockets 0 and 3, thus connecting Ring0 and Ring3 when corresponding CPU's are installed.

Overview of QuickPath Interconnect

Figure 3:
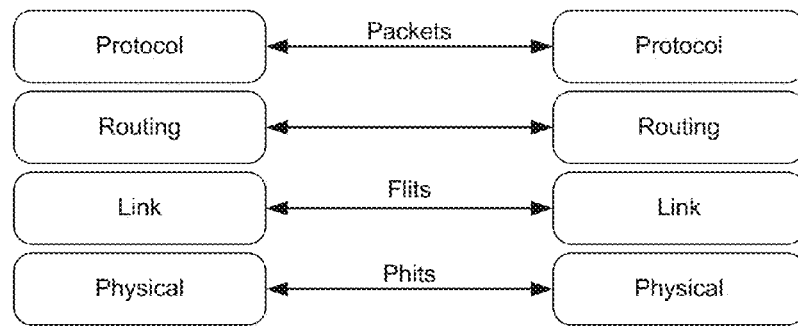
FIG. 3 shows the layers of the QPI protocol stack.

QPI transactions are facilitated via packetized messages transported over a multi-layer protocol. As shown in FIG. 3, the layers include a Physical layer, a Link layer, a Transport layer, and a Protocol layer. At the Physical layer, data is exchanged in 20-bit phits (Physical Units). At the link layer phits are aggregated into 80-bit flits (flow control units). At the Protocol layer, messages are transferred between agents using a packet-based transport.

Figure 4:
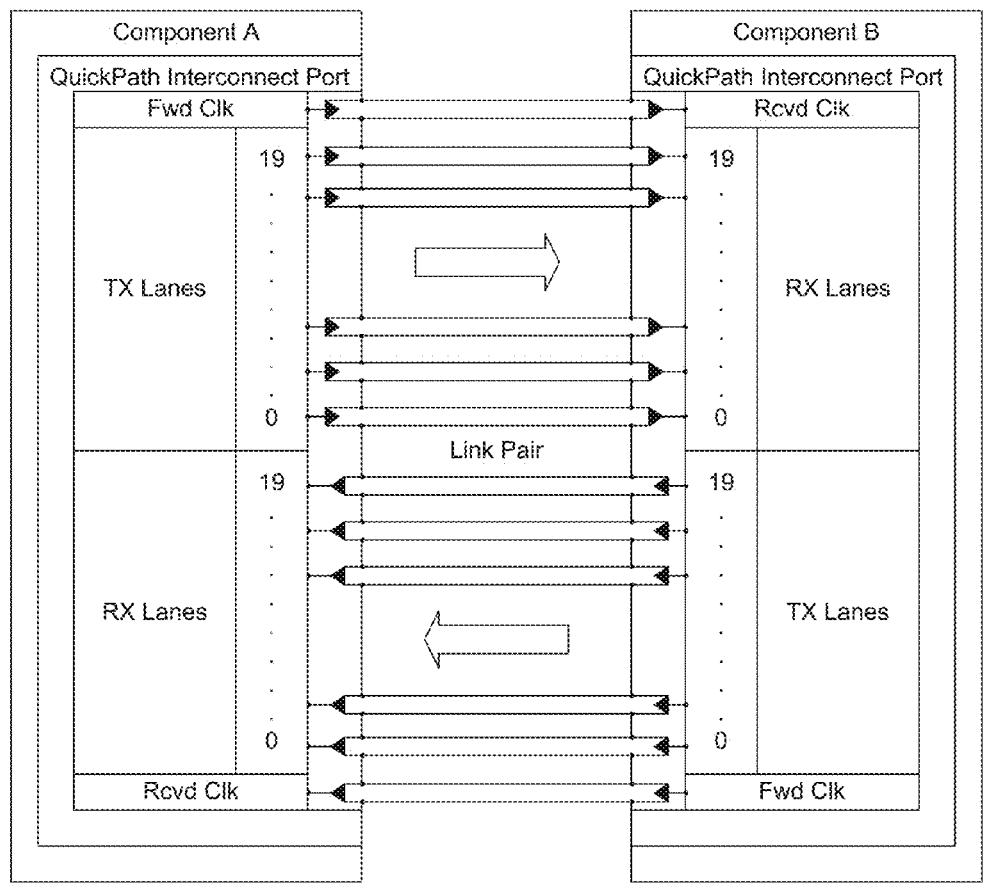
FIG. 4 is a schematic diagram illustrating the structure of a QPI link.

The Physical layer defines the physical structure of the interconnect and is responsible for dealing with details of operation of the signals on a particular link between two agents. This layer manages data transfer on the signal wires, including electrical levels, timing aspects, and logical issues involved in sending and receiving each bit of information across the parallel lanes. As shown in FIG. 4, the physical connectivity of each interconnect link is made up of twenty differential signal pairs plus a differential forwarded clock. Each port supports a link pair consisting of two uni-directional links to complete the connection between two components. This supports traffic in both directions simultaneously.

Components with QPI ports communicate using a pair of uni-directional point-to-point links, defined as a link pair, as shown in FIG. 4. Each port comprises a Transmit (Tx) link interface and a Receive (Rx) link interface. For the illustrated example, Component A has a Tx port that is connected to Component B Rx port. One uni-directional link transmits from Component A to Component B, and the other link transmits from Component B to Component A. The "transmit" link and "receive" link is defined with respect to a specific QPI agent. The Component A transmit link transmits data from Component A Tx port to Component B Rx port. This same Component A transmit link is the Port B receive link.

The second layer up the protocol stack is the Link layer, which is responsible for reliable data transmission and flow control. The Link layer also provides virtualization of the physical channel into multiple virtual channels and message classes. After the Physical layer initialization and training is completed, its logical sub-block works under the direction of the link layer, which is responsible for flow control. From this link operational point onwards, the logical sub-block communicates with the Link layer at a flit granularity (80 bits) and transfers flits across the link at a phit granularity (20 bits). A flit is composed of integral number of phits, where a phit is defined as the number of bits transmitted in one unit interval (UI). For instance, a full-width QPI link transmits and receives a complete flit using four phits. Each flit includes 72 bits of payload and 8 bits of CRC.

The Routing layer is responsible for ensuring that messages are sent to their proper destinations, and provides the framework for directing packets through the interconnect fabric. If a message handed up from the Link layer is destined for an agent in another device, the Routing layer forwards it to the proper link to send it on. All messages destined for agents on the local device are passed up to the protocol layer.

The Protocol layer serves multiple functions. It manages cache coherence for the interface using a write-back protocol. It also has a set of rules for managing non-coherent messaging. Messages are transferred between agents at the Protocol level using packets. The Protocol layer manages delivery of messages across multiple links, involving multiple agents in multiple devices. The system's cache coherency across distributed caches and memory controllers is maintained by distributed agents that participate in coherent memory space transactions, subject to rules defined by the Protocol layer. The QPI coherency protocol supports both home snoop and source snoop behaviors, as described below in further detail.

FIG. 5 shows a block architecture diagram depicted various blocks and logic to support implementation of a CPU socket-to-socket QPI link, according to one embodiment. A portion of the references in this example correspond to CPU socket-to-socket QPI link 128, but this architecture may be used for any of the CPU socket-to-socket QPI links shown in the Figures herein.

The top block in the diagram corresponds to QPI node 2-0, which is operationally coupled to ring wires 500 and 502 corresponding to Ring2. These ring wires are depicted as large arrows going in opposite directions to represent that in some embodiments a set of wires is implemented to support traversal of a ring in both a clockwise and counterclockwise direction. Moreover, ring wires 500 and 502 may comprises more than one set of ring wires in embodiments where different message classes use different physical paths (wires) on the ring.

QPI node 2-0 includes various circuitry for interfacing to QPI agent 2-0, including multiplexers 504, 506 and 508, and flip-flops 510 and 512. Each of the nodes on a ring comprise a ring "stop," wherein during a given timing cycle all of the active nodes on the ring may interface with corresponding components coupled to those nodes. As discussed above, some nodes may be buffered nodes, while other nodes may be unbuffered. The multiplexers and flip flops are controlled by clock inputs and configured to support potential inbound (i.e., onto the ring), and outbound (i.e., leaving the ring) data transfers during each ring stop clocking period.

QPI agent 2-0 includes a QPI Link Layer (LL) transmit (Tx) block 514 and a QPI LL receive (Rx) block 516, each of which is coupled to a QPI Phy (Physical layer) logical block 518. The QPI Phy logical block is coupled to a QPI AFE [What is this?] Tx block 520 and a QPI Rx block 522, which respectively send data out onto QPI wires 524 and receive data from QPI wires 526, as depicted by the larger arrows toward the center of FIG. 5.

The blocks and logic of QPI node 3-1 and QPI agent 3-1 depicted in FIG. 5 are substantially the mirror image of those for QPI node 2-0 and QPI agent 2-0. Accordingly, QPI agent includes a QPI AFE Rx block 528 and a QPI AFE Tx block 530, a QPI Phy Logical block 532, a QPI LL Rx block 534 and a QPI LL Tx block 536. QPI node 3-1 includes various blocks and logic for interfacing to ring wires 538 and 540, including multiplexers 542, 544, and 546, and flip-flops 548 and 550.

FIG. 5a shows details of a pair of QPI agents 0 and 1 interfacing with a single QPI node, such as shown in system 200a and discussed above. The QPI agents 0 and 1 are similar to those of QPI agent 2-0 shown in FIG. 5, wherein each includes a QPI LL Tx block 514, a QPI LL Rx block 516, a QPI Phy Logical block 524, a QPI AFE Rx block 520, and a QPI AFE Tx block 522. Meanwhile, the QPI node includes circuitry and logic for interfacing both of QPI agents 0 and 1 with ring wires 500 and 502, including multiplexers 560, 562, 564, and 566, and flip-flops 568 and 570.

Notably, the QPI node circuitry and logic may be configured to bypass the ring stop associated with the QPI node (effectively passing through the QPI node and thus bypassing the ring interconnect) in response to single information derived from a corresponding QPI protocol message originating from a first CPU that is external to the CPU with the QPI node and destined for a second CPU that is external to the CPU. This enables messages to be passed from a first CPU to a second CPU via a third CPU that is between the first and second CPU's while bypassing the ring circuitry of the third CPU. For example, with reference to system 200a of FIG. 2d, a message originating from a Cbo node in Socket 2 and destined for a Cbo node in Socket 0 could be routed via QPI links 128 and 130 with QPI node 3-0 operating as a pass through node.

Exemplary Implementation of Maintaining Cache Coherency Between Memory Stores on Separate CPU's Accessed Via CPU Socket Ring Links One of the inherent features of QPI is support for coherent memory transactions. This is implemented via corresponding messages in connection with memory transactions that are handled by the upper layers of the QPI protocol. The messages are communicated to applicable agents using packets, as defined by the QPI protocol layer. The following message classes are employed by the QPI protocol.

TABLE 1

| Name | Abbr | Ordering | Data Payload |
| --- | --- | --- | --- |
| Snoop | SNP | None | No |
| Home | HOM | Required for address | No |
| Non-data Response | NDR | None | No |
| Data Response | DRS | None | Yes |
| Non-coherent Standard | NCS | None | No |
| Non-coherent Bypass | NCB | None | Yes |

The requests and response messages affect either the coherent system memory space or are used for non-coherent transactions (such as configuration, memory-mapped I/O, interrupts, and messages between agents).

The system's cache coherency across distributed caches and integrated memory controllers is maintained by the distributed agents that participate in the coherent memory space transactions, subject to the rules defined by the protocol layer. The QPI coherency protocol allows both home snoop and source snoop behaviors. Home snoop behavior is optimized for greater scalability, whereas source snoop is optimized for lower latency. The latter is used primarily in smaller scale systems where the smaller number of agents creates a relatively low amount of snoop traffic. Larger systems with more snoop agents could develop a significant amount of snoop traffic and hence would benefit from a home snoop mode of operation. As part of the coherence scheme, the QPI protocol implements the well-known MESI (Modified, Exclusive, Shared, and Invalid) protocol and, optionally, introduces a new F-(Forward) state.

In one embodiment, the QPI protocol implements a modified format of the MESI coherence protocol. The standard MESI protocol maintains every cache line in one of four states: modified, exclusive, shared, or invalid. A new read-only forward state has also been introduced to enable cache-to-cache clean line forwarding. Characteristics of these states are summarized in Table 2 below. Only one agent can have a line in this F-state at any given time; the other agents can have S-state copies. Even when a cache line has been forwarded in this state, the home agent still needs to respond with a completion to allow retirement of the resources tracking the transaction. However, cache-to-cache transfers offer a low-latency path for returning data other than that from the home agent's memory.

TABLE 2

| State | Clean/Dirty | May Write? | May Forward? | May Transition To? |
|---|---|---|---|---|
| M—Modified | Dirty | Yes | Yes | — |
| E—Exclusive | Clean | Yes | Yes | MSIF |
| S—Shared | Clean | No | No | I |
| I—Invalid | — | No | No | — |
| F—Forward | Clean | No | Yes | SI |

The QPI coherency protocol consists of two distinct types of agents: caching agents and home agents. A processor will typically have both types of agents and possibly multiple agents of each type.

A caching agent represents an entity which may initiate transactions into coherent memory, and which may retain copies in its own cache structure. The caching agent is defined by the messages it may sink and source according to the behaviors defined in the cache coherence protocol. A caching agent can also provide copies of the coherent memory contents to other caching agents.

A home agent represents an entity which services coherent transactions, including handshaking as necessary with caching agents. A home agent supervises a portion of the coherent memory. Home agent logic is not specifically the memory controller circuits for main memory, but rather the additional QPI logic which maintains the coherency for a given address space. It is responsible for managing the conflicts that might arise among the different caching agents. It provides the appropriate data and ownership responses as required by a given transaction's flow.

In accordance with one embodiment, coherent memory transactions are supported via use of the QPI protocol over CPU socket-to-socket QPI links. For example, a coherent memory scheme may be implemented across CPU's such that caching agents in the various CPU's may access memory from memory stores in both the caching agent's CPU and other CPU's while maintaining memory coherency.

Home Snoop Example

Figure 6:
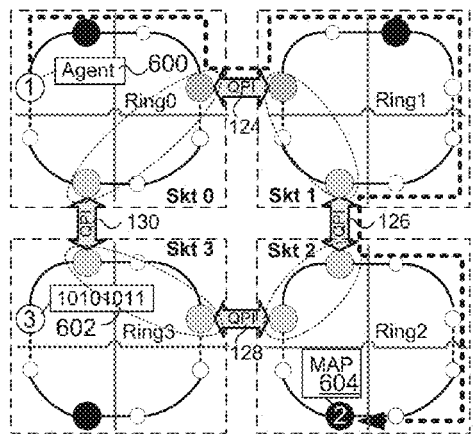
FIG. 6 is a block schematic and message flow diagram illustrating a home snoop memory coherency scheme, according to one embodiment.
Figure 6:
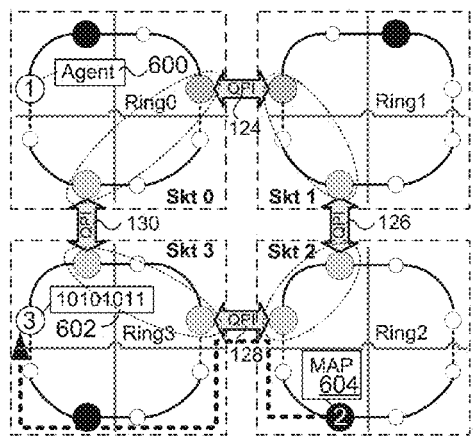
Figure 6:
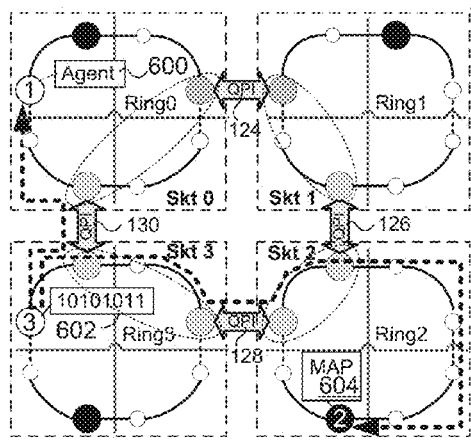
Figure 6:
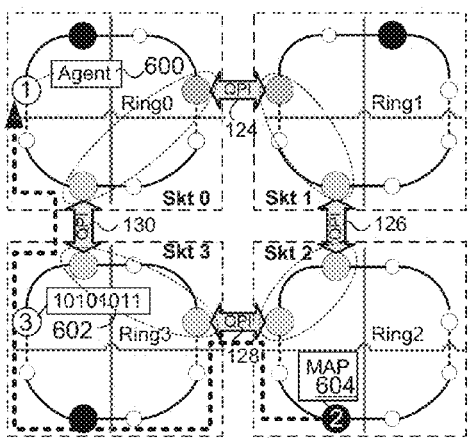

The home snoop coherency behavior defines the home agent as responsible for the snooping of other caching agents. The basic flow for a message involves up to four operations, as illustrated in the example of FIG. 6, wherein the rings shown correspond to the ring interconnects Ring0, Ring1, Ring2 and Ring3 in corresponding processors (CPU's) shown in system 200. In this example, a simplified read request to an address managed by a remote agent is performed, where an agent 600 is the requesting caching agent coupled to a node 1 in Ring0, Ring1 and Ring3 include one or more peer caching agents, and Ring2 includes a home agent 2 that is the home agent for the cache line. In addition, an agent at node 3 in Ring3 has a copy of the cache line 602 in either an M, E, or F-state.

In a first operation, the caching agent 600 issues a request to home agent 2 that manages the memory in question. In general, each processor will manage a corresponding portion of shared memory, typically via address range mapping or the like. Meanwhile, each home agent maintains a directory structure (depicted as a map 604) that is used to track which agents are holding cache lines corresponding to memory the home agent manages. Also, each of the caching agents will maintain a memory map identifying which home agent is associated with which memory range or ranges. In addition, each processor will typically include facilities for abstracting the physical memory map from the logical memory map presented to the operating system to support functionality such as memory mirroring, memory re-mapping (e.g., in view of detected memory errors).

Next, in a second operation, home agent 2 checks its directory structure to target a snoop to the caching agent identified as holding a cache line corresponding to the memory address in the request. In this example, the directory structure in map 604 indicates that agent 3 holds the cache line, and thus home agent 2 sends a snoop request to agent 3.

In response to the snoop request, caching agent 3 sends a response back to home agent 2 with the status of the address in a third operation. In this example, agent 3 has a copy of the cache line 602 in the proper state, and so it delivers a copy of the cache line data to agent 1. Agent 3 also responds to home agent 2 indicating that it has sent the data to agent 1. The home agent resolves any conflicts, and if necessary, returns the data to the original requesting cache agent (after first checking to see if data was delivered by another caching agent, which in this case it was), and the transaction is completed. This is shown in a fourth operation, wherein home agent 2 provides a message to agent 1 indicating the transaction is complete.

The QPI home snoop behavior implementation typically includes a directory structure to target the snoop to the specific caching agents that may have a copy of the data. This has the effect of reducing the number of snoops and snoop responses that the home agent has to deal with on the interconnect fabric. This is very useful in systems that have a large number of agents, although it comes at the expense of latency and complexity. Therefore, home snoop is targeted at systems optimized for a large number of agents.

Data is transferred between entities using a combination of ring segments in Rings 0-3, and CPU socket-to-socket QPI links 124, 126, 128, and 130. In the examples illustrated in FIG. 6, all transfers (depicted by wide dotted lines with an arrow pointing to the receiving entity) are shown traversing the rings and QPI links in a clockwise manner. However, this is merely for illustrative purposes, as rings may be traversed in both clockwise and counterclockwise directions, and a given data transfer may include a traversal of one ring in one direction and traversal of other rings in the opposite direction.

For example, during the first operation, a data transfer is made from node 1 in Ring0 to home agent 2 in Ring2. This illustrated traversal begins at node 1 and traverses Ring0 in the clockwise direction until it reaches QPI node 0-1 (see the more detailed view shown in FIG. 2*b*), which is the egress point for transfer to QPI node 1-0 via CPU socket-to-socket QPI link 124. The transfer is then routed around Ring1 in the clockwise direction until it reaches QPI node 1-1, at which point it crosses to the CPU in socket 2 (corresponding to Ring2) via CPU socket-to-socket QPI link 126. The transfer then is routed clockwise around Ring2 until it reaches home agent 2. The other data transfers are illustrated in a similar manner.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A system, comprising:
   a main board having a plurality of Central Processing Unit (CPU) sockets,
   a plurality of CPU's, each installed in a respective CPU socket and including a plurality of processor cores;
   a plurality of CPU socket-to-socket interconnect links operatively coupled between the plurality of CPU sockets so as to form a CPU socket-to-socket ring interconnect;
   wherein each CPU is further configured to facilitate communication between itself and each of the other CPUs by sending data via the plurality of CPU socket-to-socket interconnect links, and wherein each of the CPUs comprises a plurality of processor cores operatively coupled to respective ring stop nodes in a ring interconnect internal to each CPU.

2. The system of claim 1, wherein each CPU is further configured to facilitate communication between itself and other CPU's using a packet-based protocol under which packetized data is transferred between CPU's via the plurality of CPU socket-to-socket interconnect links.

3. The system of claim 2, wherein the packet-based protocol is the QuickPath Interconnect (QPI) protocol.

4. The system of claim 2, wherein the plurality of processor cores in each CPU are operatively coupled to a memory controller and at least one coherency agent, wherein the memory controller and the at least once coherency agent are configured to manage access to memory operatively couplable to the memory controller, and wherein the packet-based protocol supports coherent memory transactions across CPU's.

5. The system of claim 1, wherein at least one of the CPU's includes a first and second ring stop node operatively coupled to respective CPU socket-to-socket interconnect links, wherein the first and second ring stop nodes are separate from the respective ring stop nodes in the ring interconnect operative coupled to the plurality of processor cores.

6. The system of claim 1, wherein at least one of the CPU's includes a single ring stop node operatively coupled to respective CPU socket-to-socket interconnect links, wherein the single ring stop node is separate from the respective ring stop nodes in the ring interconnect operative coupled to the plurality of processor cores.

7. The system of claim 6, wherein at least one of the CPU's that includes a single ring stop node operatively coupled to respective CPU socket-to-socket interconnect links is configurable to enable data to be transferred via the respective CPU socket-to-socket interconnect links in a manner that bypasses the ring interconnect internal to the CPU.

8. The system of claim 6, wherein the plurality of CPU's are configured to effect routing of packets between CPU's by inserting a packet at a first ring stop node on a first ring interconnect internal to a first CPU, routing the packet across a CPU socket-to-socket interconnect link to a second CPU, and routing the message to a component coupled to a second ring stop node on a second ring interconnect internal to the second CPU.

9. The system of claim 1, wherein the system is configured to support coherent memory accesses under which a processor core in a first CPU is enabled to access memory managed via a memory controller in a second CPU that is not directly linked to the first CPU via a CPU socket-to-socket interconnect link between the first and second CPU's.

10. A method, comprising:
    implementing a memory coherency protocol in a computer system having shared memory resources and including a plurality of Central Processing Units (CPU's) operatively coupled to one another via a plurality of CPU socket-to-socket ring interconnect links so as to form a CPU socket-to-socket ring interconnect, wherein a processor core in a first CPU is enabled to access a memory resources that are managed by memory controllers in other CPU's while supporting coherent memory transactions,
    wherein each of the CPUs comprises a plurality of processor cores operatively coupled to respective ring stop nodes in a ring interconnect internal to each CPU.

11. The method of claim 10, further comprising implementing a coherent memory transaction using packetized messages sent over a transfer path including at least two CPU socket-to-socket ring interconnect links.

12. The method of claim 11, wherein the memory coherency protocol is the QuickPath Interconnect (QPI) protocol.

13. The method of claim 10, wherein each CPU includes a ring interconnect and at least one CPU socket-to-socket ring interconnect link is configured to enable bypass of a ring interconnect, the method further comprising routing a message from a first CPU to a second CPU via a first socket-to-socket ring interconnect link between the first CPU and a third CPU and via a second socket-to-socket ring interconnect link between the third CPU and the second CPU, wherein the ring interconnect on the third CPU is bypassed.

14. A Central Processing Unit (CPU), comprising:
a plurality of pins or pads, configured to be coupled to a mating CPU socket of a main board to facilitate communication between the CPU and circuitry on the main board when the CPU is installed in the CPU socket;
a ring interconnect having a plurality of nodes including ring stop nodes;
a plurality of processor cores, each operatively coupled to a respective ring stop node; and
first and second interconnect interfaces operatively coupled to a single node or respective nodes, each interconnect interface coupled to a portion of the pins or pads corresponding to mating components in the CPU socket that are coupled to wires on the main board comprising first and second CPU socket-to-socket interconnect links,
wherein the CPU is further configured to be installed as one of a plurality of CPU's on a main board having a plurality of CPU sockets communicatively coupled via a plurality of CPU socket-to-socket interconnect links so as to form a CPU socket-to-socket ring interconnect, and further wherein the CPU is configured, when installed on the main board, to support communication between nodes on the CPU and nodes on another CPU coupled to the main board by transferring data via the first and second interconnect interfaces across CPU socket-to-socket interconnect links.

15. The CPU of claim 14, wherein the CPU is further configured, when installed on the main board, to facilitate communication between itself and other CPU's installed on the main board using a packet-based protocol under which packetized data is transferred between CPU's via the plurality of CPU socket-to-socket interconnect links, wherein communications between the CPU and at least one other CPU traverses at least two CPU socket-to-socket interconnect links along the CPU socket-to-socket ring interconnect.

16. The CPU of claim 15, wherein the plurality of processor cores are operatively coupled to a memory controller and at least one coherency agent, wherein the memory controller and the at least once coherency agent are configured to manage access to memory operatively couplable to the memory controller, and wherein the packet-based protocol supports coherent memory transactions across CPU's.

17. The CPU of claim 15, wherein the CPU, when installed on the main board in a first CPU socket, is configured to effect routing of packets between itself and a second CPU installed on the main board in a second CPU socket linked in communication with the first CPU socket via a first socket-to-socket interconnect link by inserting a packet at a first node on the ring interconnect in the CPU, and routing the packet around the ring interconnect in the CPU to a second node in the CPU operatively coupled to the first interconnect interface, and then routing the packet from the second node across the CPU socket-to-socket interconnect link to the second CPU.

18. The CPU of claim 17, wherein the CPU is configured to receive packets originating from a third CPU installed on the main board in a third CPU socket linked in communication with the first CPU socket via a second CPU socket-to-socket interconnect link at a node operatively coupled to the second interconnect interface to facilitate transfer of packets between the third CPU and the CPU via the second CPU socket-to-socket interconnect link.

19. The CPU of claim 14, wherein the first and second interconnect interfaces are operatively coupled to a single node and are configurable to enable transfer of data between the first and second interconnect interfaces so as to bypass the ring interconnect.

* * * * *